United States Patent [19]

Morris

[11] 4,335,391
[45] Jun. 15, 1982

[54] NON-VOLATILE SEMICONDUCTOR MEMORY ELEMENTS AND METHODS OF MAKING

[75] Inventor: Henry B. Morris, Plano, Tex.

[73] Assignee: Texas Instruments Incorporated, Dallas, Tex.

[21] Appl. No.: 968,544

[22] Filed: Dec. 11, 1978

[51] Int. Cl.³ ............................................. H01L 29/78
[52] U.S. Cl. ........................................ 357/23; 357/41; 357/45; 357/54; 365/182
[58] Field of Search ...................... 357/23, 54, 41, 45; 365/182

[56] References Cited

U.S. PATENT DOCUMENTS

| | | | |
|---|---|---|---|
| 3,681,155 | 8/1972 | Elgan et al. | 357/54 |
| 4,001,871 | 1/1977 | Tsunemitsu | 357/54 |
| 4,151,537 | 4/1979 | Goldman et al. | 357/54 |

OTHER PUBLICATIONS

Electronics Letters—vol. 6, No. 16, p. 507, 8-6-70.

Primary Examiner—Edward J. Wojciechowicz
Attorney, Agent, or Firm—Robert Groover; Jim Comfort; Rene' E. Grossman

[57] ABSTRACT

The invention is embodied in a non-volatile metal-insulator-semiconductor having a novel combination of insulating layers including a titanium dioxide layer covered by a silicon dioxide layer. In one embodiment of the invention the insulator combination also includes a second layer of silicon dioxide located between the titanium dioxide and the semiconductor. In another embodiment the insulator combination also includes a layer of silicon nitride located between the titanium dioxide layer and the semiconductor. The memory elements are fabricated using a novel sequence of steps for forming multiple dielectric layers. The titanium dioxide of a type known as rutile is formed by evaporation of titanium metal upon the silicon dioxide and oxidation of the titanium in an oxygen ambient at high temperatures. Writing is accomplished by injection of charge into the titanium dioxide layer thus shifting the threshold voltage of the structure. Erasure is accomplished by forcing the injected charge back into the semiconductor to recombine with majority carriers. The charge can be electrons or holes depending on the semiconductor type. The memory element of the invention has lower write/erase voltages, shorter write/erase times and longer memory retentivity.

11 Claims, 17 Drawing Figures

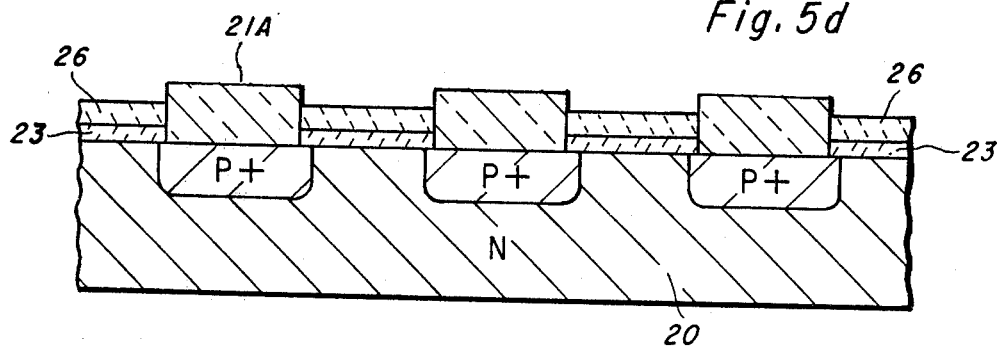
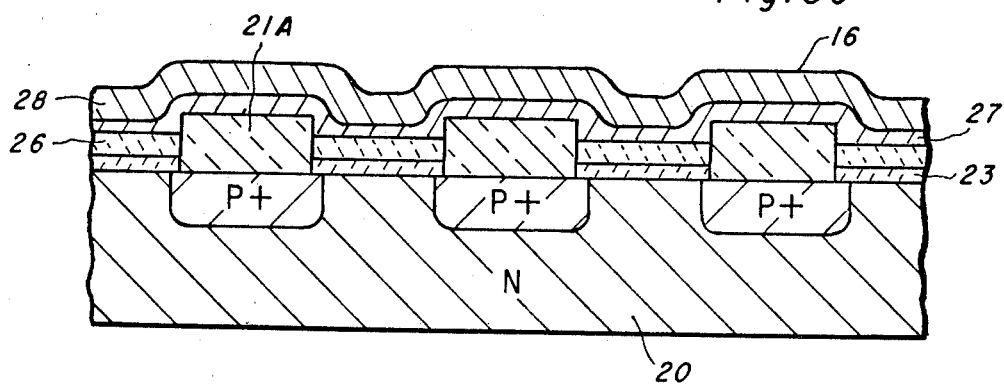

4,335,391

NON-VOLATILE SEMICONDUCTOR MEMORY ELEMENTS AND METHODS OF MAKING

BACKGROUND OF THE INVENTION

This invention is directed to semiconductor memory devices and methods of making such devices, and more particularly, to non-volatile metal-insulator-semiconductor (MIS) memory elements having multiple insulating layers and methods of making said devices.

The earliest semiconductor memories were bipolar, usually transistor-transistor logic (TTL), and were very limited in the number of bits. With the development of the MOS technologies bit density has increased dramatically. At the present time N-channel MOS memories are being fabricated with 16,384 bits of memory per chip. However most of the memory devices available today are volatile, that is they lose the information stored in them when the power to the device is turned off. This disadvantage has led to efforts to create non-volatile semiconductor devices. Several non-volatile devices have been developed to meet this demand. One of them is described in U.S. Pat. No. 3,660,819. Another is described in U.S. Pat. No. 3,881,180. The MNOS device is another invention which offers a non-volatile memory. Such a device is described in Chang, Proceedings of the IEEE, Vol. 64, No. 7, July, 1976, pp. 1039-1059. However all of these devices have various disadvantages. Some of them require exposure to ultraviolet light to erase the information stored in the memory cells. Others are too large for high density designs. The MNOS while offering high density design capability and electrical erasure of stored information, requires high write/erase voltages and long write/erase times.

In copending U.S. patent application, Ser. No. 963,855, filed Nov. 27, 1978 (now U.S. Pat. No. 4,242,737) entitled "Non-volatile Semiconductor Memory Elements" by Robert T. Bate, a memory structure is disclosed which offers the advantages provided by so-called MNOS devices while substantially eliminating or reducing the effect of the disadvantages thereof, i.e. high write/erase voltages and long write/erase times.

SUMMARY OF THE INVENTION

The invention is embodied in a non-volatile metal-insulator-semiconductor having a novel combination of insulating layers including a titanium dioxide layer covered by a silicon dioxide layer. In one embodiment of the invention the insulator combination also includes a second layer of silicon dioxide located between the titanium dioxide and the semiconductor. In another embodiment the insulator combination also includes a layer of silicon nitride located between the titanium dioxide layer and the semiconductor. The memory elements are fabricated using a novel sequence of steps for forming multiple dielectric layers. The titanium dioxide of a type known as rutile is formed by evaporation of titanium metal upon the silicon dioxide and oxidation of the titanium in an oxygen ambient at high temperatures. Writing into the memory element is accomplished by applying a voltage between the gate and the semiconductor causing minority carriers in the semiconductor to tunnel through the nitride or oxide directly upon the semiconductor into the titanium dioxide layer and increase the threshold voltage of the structure. The charge is trapped in the titanium dioxide near the interface between the nitride or oxide layer directly upon the silicon and the titanium dioxide. Erasure is accomplished by reversing the voltage applied between the gate and semiconductor and causing carriers to tunnel back into the semiconductor and recombine with majority carriers. The carriers are electrons with a P-type semiconductor and holes with an N-type semiconductor. The memory element of the invention has lower write voltages, shorter write times and higher memory retentivity.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings wherein:

FIG. 4 is a greatly enlarged view of an area of the section of FIG. 3a;

FIGS. 5a-5e are elevation views in section of the cells of FIG. 1 taken along the line a—a at successive stages in the manufacturing process;

FIG. 9 is a greatly enlarged view of an area of the section of FIG. 8a.

DETAILED DESCRIPTION OF SPECIFIC EMBODIMENT

Figure 1:
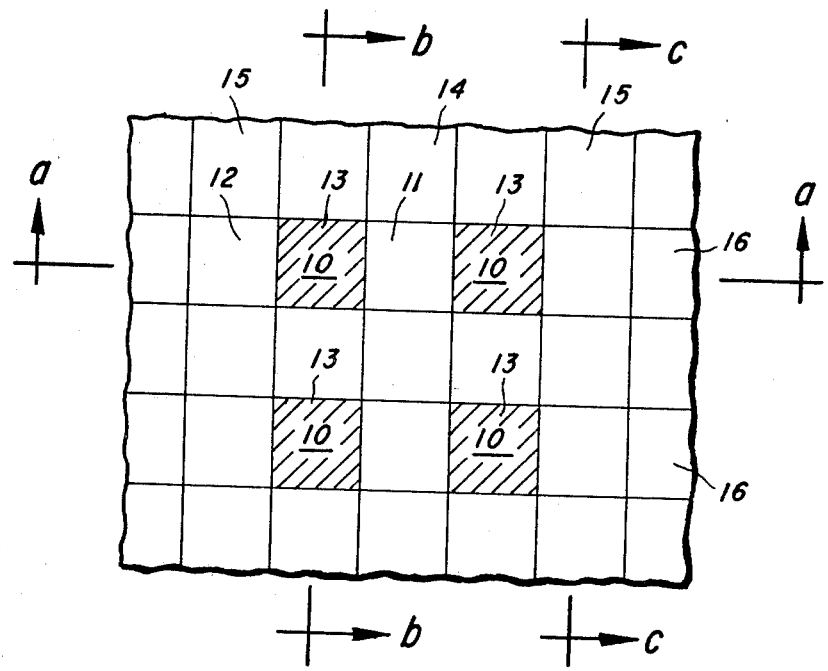
FIG. 1 is a greatly enlarged plan view of a small portion of a semiconductor chip showing the physical layout of an array of RAM cells.
Figure 2:
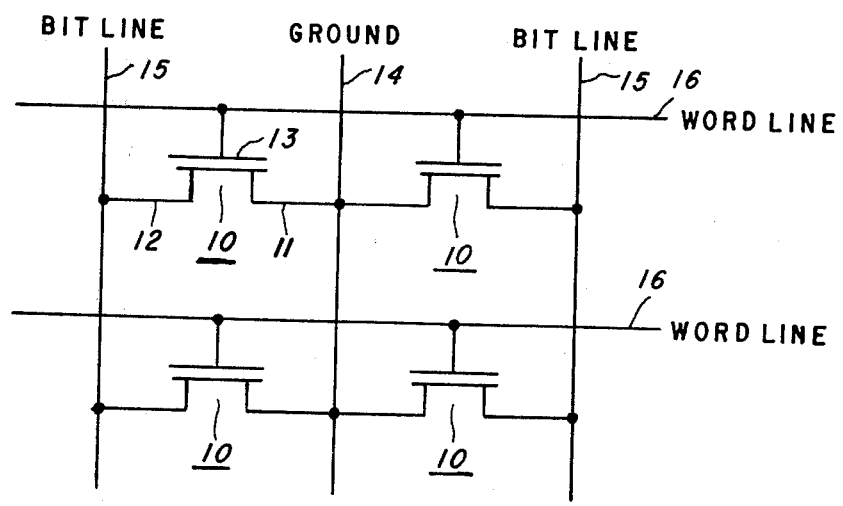
FIG. 2 is an electrical schematic of the RAM array of FIG. 1.
Figure 3A:
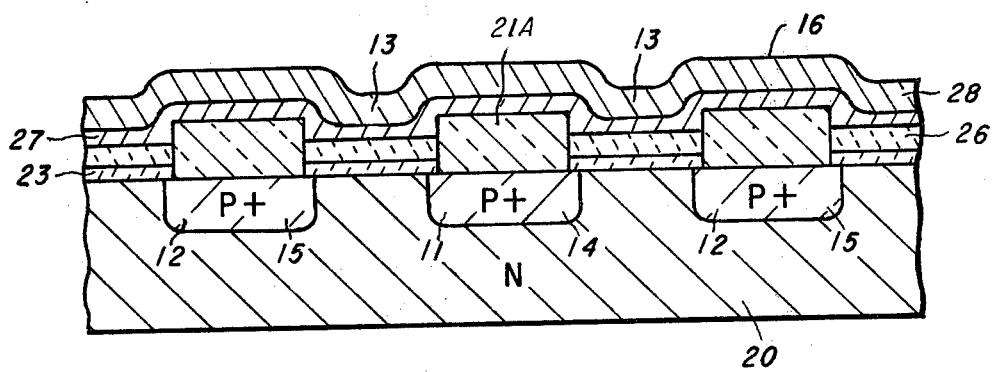
FIGS. 3a-3c are elevation views in section of the cells of FIG. 1, taken along the lines a—a, b—b and c—c respectively.
Figure 3B:
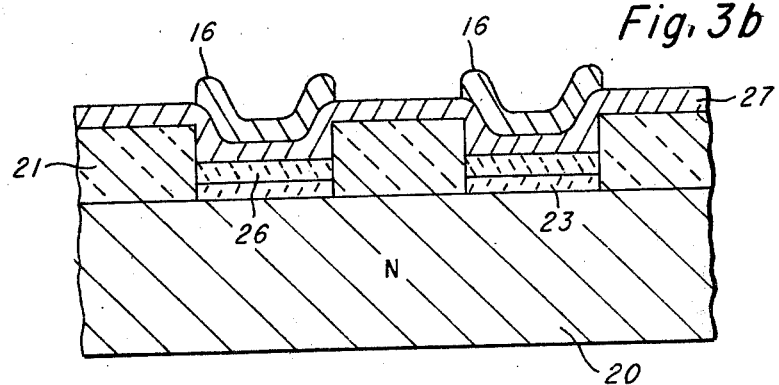
Figure 3C:
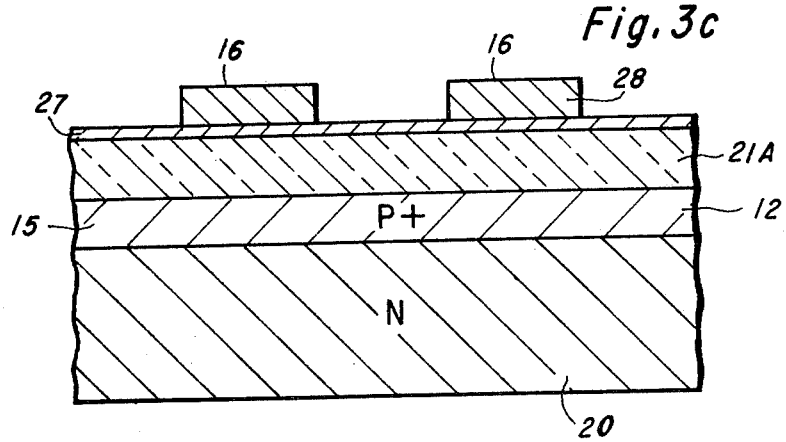
Figure 4:
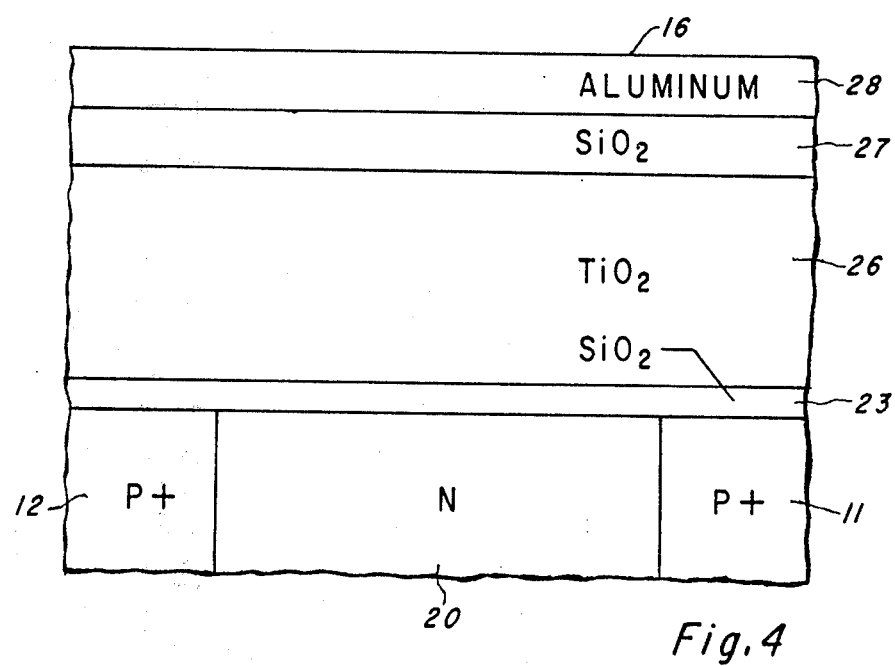

Referring to FIG. 1, a physical layout of an array of RAM cells using the memory element of the invention is shown. The array is of course greatly enlarged in FIG. 1 as each cell would occupy less than 1 square mil. The cell in this embodiment consists of a MOS transistor 10, a word line 16, a bit line 15 and a ground line 14, all of which are also seen in the electrical schematic diagram of FIG. 2.

Referring to FIGS. 3a-3c and 4, sectional views of the memory cells of FIG. 1 show the details of construction. It should be kept in mind when examining the section views that not all geometries, junction depths and layer thicknesses are necessarily to scale, some having been enlarged or reduced where necessary to reflect features of the invention. The transistor 10 is formed in a silicon substrate 20 and has a source 11 which is part of a diffused region forming the ground line 14. A drain region 12 is provided by diffused region which forms a bit line 15. A layer 21A of silicon dioxide covers the source 11 and drain 12 areas. An elongated strip 28 of aluminum forms the transistor gate 13 and is also a word line 16. The gate dielectric is composed of a first layer 23 of silicon dioxide, a layer 26 of titanium dioxide and a second layer 27 of silicon dioxide which extends over the entire slice except in the contact areas.

Field oxide 21 covers the slice except in the gate 13 and source 11 and drain 12 areas.

Figure 5A:
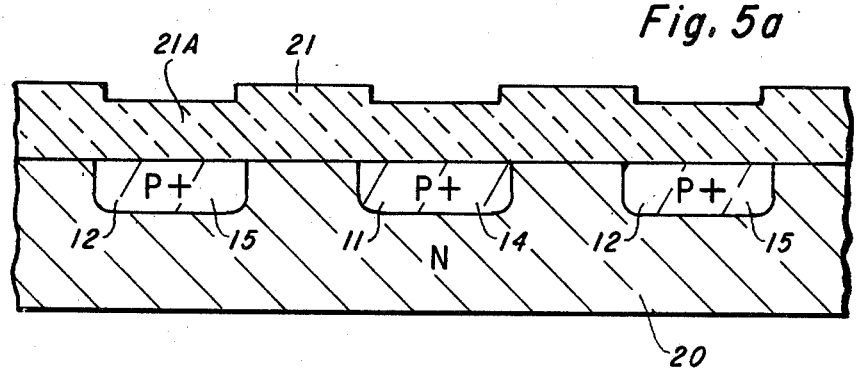

Referring to FIGS. 5a–5e a process for making the RAM of FIG. 1 is described. The starting slice is N-type monocrystalline silicon perhaps 3 inches in diameter cut on the 100 plane with a resistivity of perhaps 8–10 ohms-cm. The first stage of the process is the formation of the source and drain regions 11, 12. First, an oxide layer 21 is grown on the slice by subjecting the slice to a steam ambient in a high temperature furnace tube. Then a layer of photoresist is applied and patterned, removing resist from areas where sources and drains are desired. All patterning techniques used are known and therefore no elaboration will be necessary. The oxide layer not covered with photoresist is removed by subjecting the slice to an oxide etch. The resist is removed and the slice is subjected to a high temperature furnace operation whereby boron is "deposited" in a surface adjacent region in the source and drain areas. The excess doping material is removed and the "deposited" boron is diffused further into the slice, completing the source and drain formation, by subjecting the slice to an oxidizing ambient in a high temperature furnace tube. During the diffusion step, an oxide layer 21A is grown over the source and drain areas. FIG. 5a represents the slice at this point in the process.

Figure 5B:
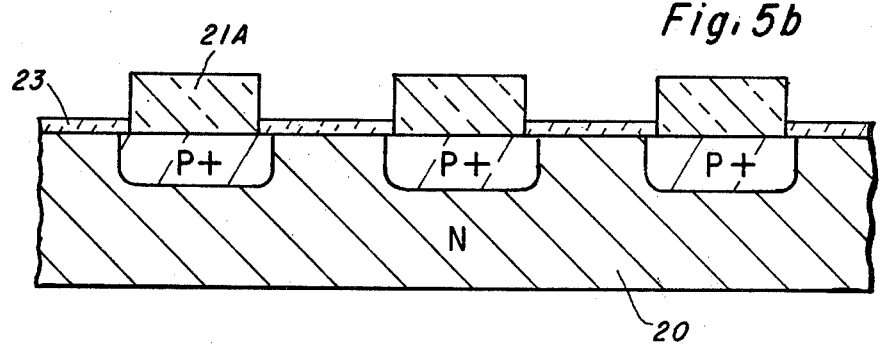

The next step in the process is to begin formation of the gate dielectric, a key feature of the invention. A layer of photoresist is applied and patterned removing the resist from areas where the gate dielectric is to be formed. The oxide not covered with photoresist is removed by subjecting the slice to an oxide etch. The photoresist is then removed. Then, the first silicon dioxide layer 23 is grown on the silicon by subjecting the slice to room temperature air for a few minutes or to boiling $H_2O_2/H_2SO_4$ or hot $HNO_3$. If a thicker layer is desired, the slice can be exposed to an oxidizing ambient in a high temperature furnace tube. Techniques for forming such layers are known and are used in fabricating MNOS devices. The oxide layer 23 has a thickness of 10–150 Angstroms, preferably 20–80 Angstroms. FIG. 5b represents the slice at this point in the process.

Figure 5C:
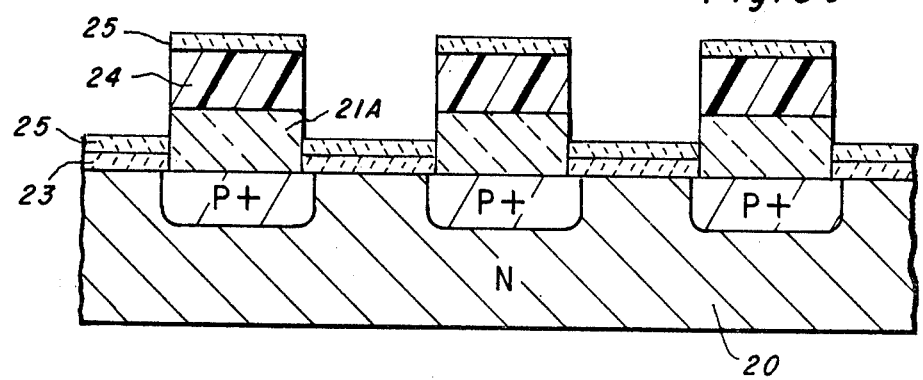

The next stage of the process is the formation of the titanium dioxide layer 26. The formation of titanium dioxide (rutile) upon semiconductors is described in a copending application, METHOD OF DEPOSITING TITANIUM DIOXIDE (RUTILE) AS A GATE DIELECTRIC FOR MIS DEVICE FABRICATION, by Henry B. Morris, Ser. No. 962,259, filed Nov. 20, 1978 (now U.S. Pat. No. 4,200,474). The formation of the titanium dioxide is one of the key features of the invention because it allows the use of lower write and erase voltages. There are several ways in which the titanium dioxide could be formed. First, titanium could be evaporated upon the slice, patterned using conventional resist techniques, and then oxidized to form titanium dioxide. Second, a layer of resist could be applied to the slice and patterned, removing the resist from areas where titanium dioxide is desired. Then titanium dioxide would be evaporated upon the patterned resist and popped off from those areas where resist is located. A preferred technique of forming the titanium dioxide layer is described as follows. A coating 24 of photoresist is applied and patterned, leaving photoresist in those areas where titanium dioxide is not desired. The slice is then placed in an e-gun metal evaporator and a layer 25 of titanium is evaporated upon the slice patterned with with photoresist. The titanium is evaporated to a thickness of about 100–1500 Angstroms, preferably 500–600 Angstroms, leaving the slice as shown in FIG. 5c. Parts of the titanium layer 25 will later be converted to titanium dioxide. The titanium upon the photoresist will then be popped off using conventional techniques. Residual photoresist is then removed and the slice is subjected to an oxygen ambient in a high temperature furnace tube at 200–1200 Degrees C., preferably 700 Degrees C. for perhaps 2 hours. This oxidation step converts the titanium layer 25 to a layer 26 of titanium dioxide known as rutile. When the titanium is converted to titanium dioxide, it increases in thickness by about 77%. FIG. 5d represents the slice at this point in the process.

The last step in the formation of the gate dielectric is next. A second layer 27 of silicon dioxide is deposited upon the entire slice using known chemical vapor deposition (CVD) techniques. The oxide layer 27 has a thickness of 40–200 Angstroms, preferably 100 Angstroms. This layer 27 is a key feature of the invention because it, along with the first silicon dioxide layer 23, isolates the titanium dioxide islands and prevents charge stored on the islands from leaking off. This increases the retentivity of the memory. This layer 27 is shown in FIG. 5e.

The next stage of the process is the formation of the device contacts. The contacts are formed by applying and patterning a layer of photoresist and removing the resist from areas where the contacts are desired. The oxide not covered with resist is removed by subjecting the slice to an oxide etchant. These process steps are not shown in any of the FIGURES since there are only contacts in the periphery of the memory array. The resist is then removed.

The last stage of the process is the formation of the metal interconnects. The slice is placed in a metal evaporator and a layer 28 of aluminum is evaporated upon the slice. A coating of photoresist is applied and patterned leaving resist where metal interconnects are desired. The areas of aluminum not covered with resist are removed by subjecting the slice to an aluminum etchant. The resist is removed and the slice is subjected to a hydrogen ambient in a high temperature furnace tube to sinter the aluminum interconnects, thereby completing the fabrication process and leaving the slice as shown in FIG. 5e.

Figure 6:
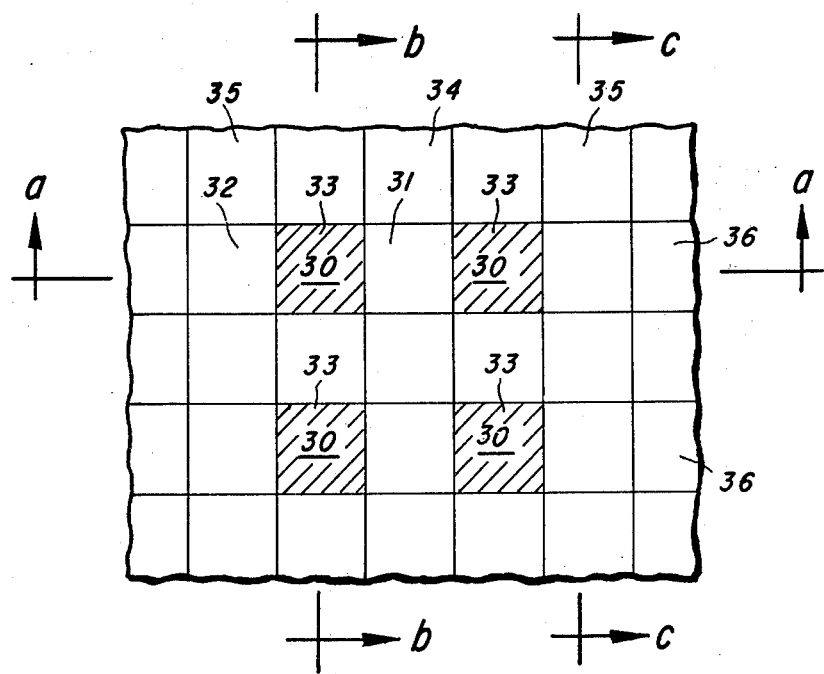
FIG. 6 is a greatly enlarged plan view of a small portion of a semiconductor chip showing the physical layout of an array of RAM cells.
Figure 7:
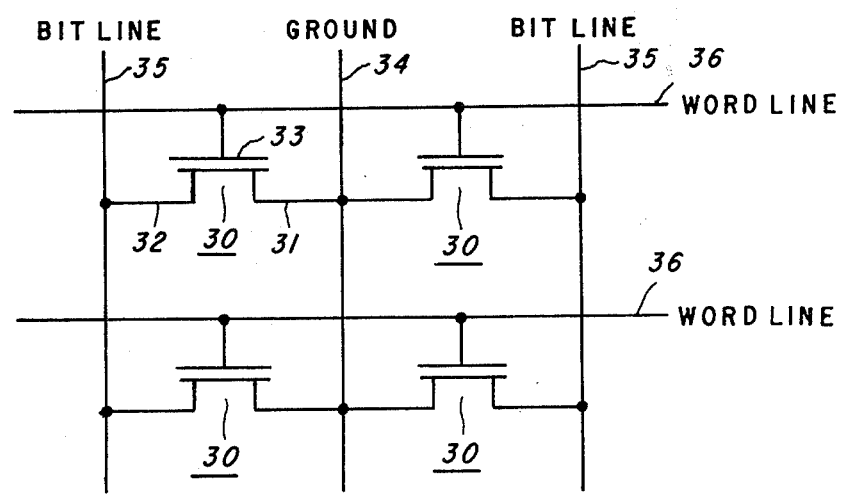
FIG. 7 is an electrical schematic of the RAM array of FIG. 6.
Figure 8A:
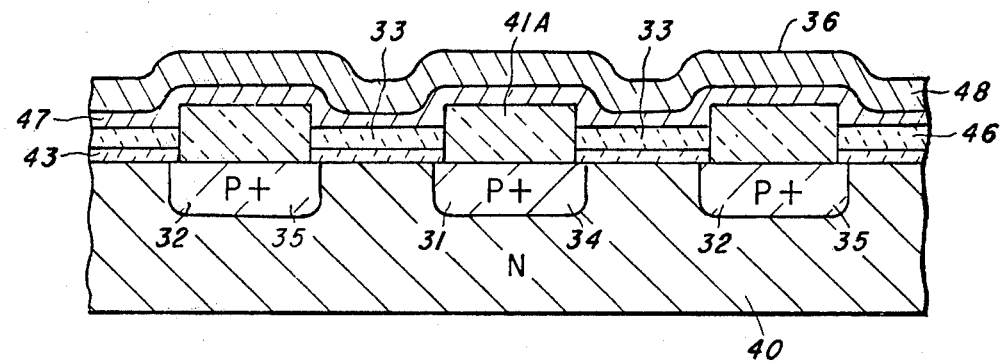
FIGS. 8a-8c are elevation views in section of the cells of FIG. 6, taken along the lines a—a, b—b and c—c respectively.
Figure 8B:
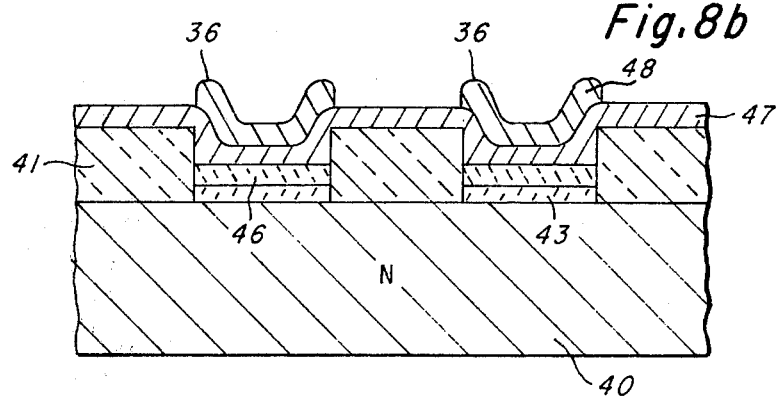
Figure 8C:
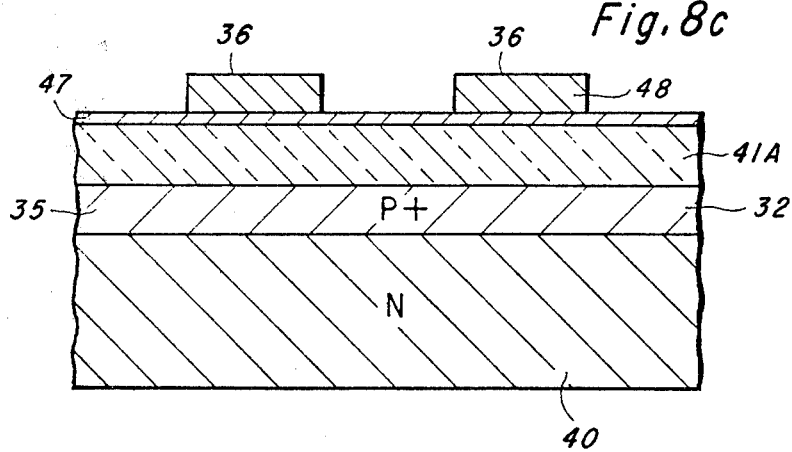
Figure 9:
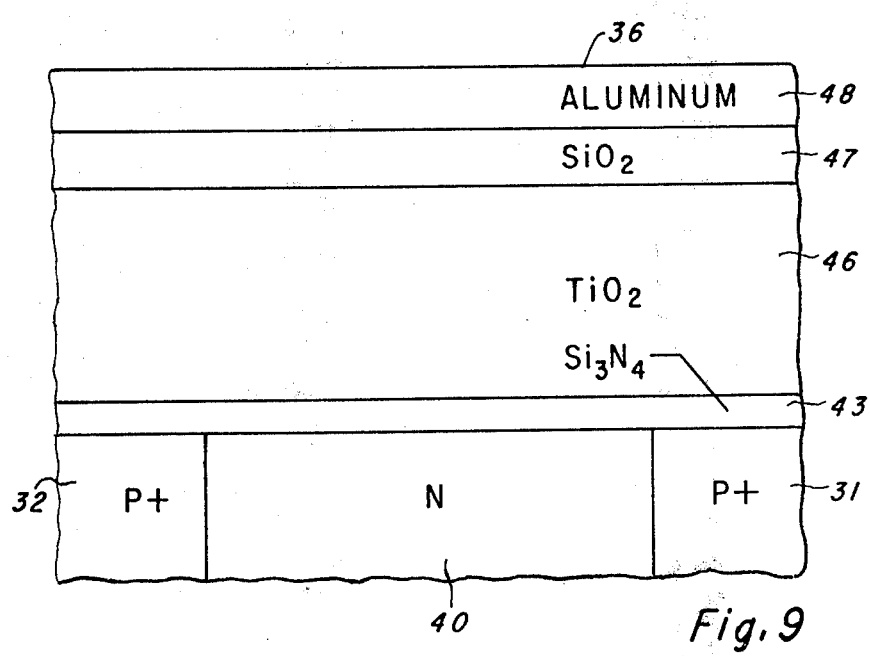

Referring to FIG. 6, a physical layout of an array of RAM cells using a second embodiment of the invention is shown. The array is of course greatly enlarged in FIG. 6 as each cell would occupy less than 1 square mil. The cell in this embodiment consists of a MOS transistor 30, a word line 36, a bit line 35 and a ground line 34, all of which are also seen in the electrical schematic diagram of FIG. 7.

Referring to FIGS. 8a–8c and 9, sectional views of the memory cells of FIG. 6 show the details of construction. The transistor 30 has a source 31 which is part of a diffused region which forms a bit line 35. An elongated strip 48 of aluminum forms the transistor gate 33 and is also a word line 36. The gate dielectric is composed of a layer of silicon nitride 43, a layer 46 of titanium dioxide and a layer 47 of silicon dioxide which also extends over the entire slice except in the contact areas.

Referring to FIGS. 8a–8c and 9 a process for making the RAM of FIG. 6 is described. The process for making the device using this embodiment is the same as previously described except at the formation of the gate dielectric. In this embodiment care must be taken to insure that no oxide layer is formed on the silicon in the gate dielectric area prior to the deposition of silicon. In the embodiment shown in FIGS. 8a–8c and 9 a very thin silicon nitride layer 43 is desired instead of the first silicon dioxide layer 23. This nitride layer 43 is deposited upon the slice by placing the slice in a high temperature chemical vapor deposition (CVD) reactor. The nitride is grown to a thickness of 10–150 Angstroms, preferably 20–80 Angstroms. This is the only difference in the two processes.

As previously mentioned the RAM cell uses the memory elements of the invention. The RAM cell here is a simple MOS transistor. To write information into the cell the source (11,31), drain (12,32), and substrate (20,40) are grounded and a negative voltage of about −10 volts is applied to the gate (13,33). This causes holes to tunnel from the inversion layer in the substrate (20,40) through the silicon dioxide 23 or silicon nitride 43 into the valence band of the titanium dioxide (26,46). This tunneling will occur in both embodiments of the invention. Holes will be distributed in the titanium dioxide 26 with the greatest density near the interface between the first silicon dioxide layer 23 or the silicon nitride 43 and the titanium dioxide layer (26,46). The second oxide layer (27,47), a key feature of the invention, acts as a barrier to the holes and prevents most of them from reaching the aluminum gate (28,48), where they would ultimately leak to ground. The placement of these holes in the titanium dioxide (26,46) acts to increase the threshold voltage of the transistor (10,30). The threshold voltage is shifted by an amount, usually −7 volts, that is larger than the voltage that is applied to the gate during the read operation. A memory cell whose transistor has its threshold voltage shifted, is referred to as having a "1" stored in it. Those memory cells whose transistors have not had their threshold voltages shifted are referred to as having a "0" stored in them.

To read information from the cells the source (11,31) and the substrate are grounded and a negative voltage (about −5 volts) is applied to the gate (13,33). A negative voltage is then applied to the drain and the current flow from source to drain is measured. The −5 V applied to the gate is greater than the threshold voltage of a transistor which has not had its threshold voltage shifted. Consequently in those cells with a stored "0" current will flow from source to drain during the read operation. In those cells with a stored "1" no current will flow from source to drain during the read operation.

To erase information in the cells the source (11,31), drain (12,32) and substrate (20,40) are grounded and a positive voltage of about +8 volts is applied to the gate. This causes the holes in the titanium dioxide to tunnel back into the silicon and recombine with electrons.

Another of the features of the invention is the use of the titanium dioxide layer (26,46) as part of the gate dielectric. Titanium dioxide of the type formed here has a dielectric constant of approximately 125 which means that when a voltage is applied from the gate (13,33) to the substrate (20,40) very little voltage drop occurs across the titanium dioxide layer (26,46). Most of the voltage drop occurs across the first and second silicon dioxide layers or across the silicon nitride and silicon dioxide layers depending on which embodiment is used. Other suitable insulators with approximately the same high dielectric constant as titanium dioxide, such as zirconium oxide, hafnium oxide and tantalum oxide, may be useable instead of titanium dioxide. Silicon dioxide has a dielectric constant of about 3.9, and silicon nitride has a dielectric constant of about 7.0. If either were used in place of the titanium dioxide the write/erase voltages would be similar to those used on MNOS, defeating a main purpose of the invention. Since most of the voltage drop does not occur across the titanium dioxide, voltages lower than those used on similar structures without titanium dioxide can be applied to the structure to write and erase. The use of lower circuit voltages has advantages.

Another advantage of the low voltage drop across titanium dioxide is that write and erase times can be reduced. Although the write/erase voltages are less than half of those used on MNOS devices, the electric field strength in the silicon dioxide and the silicon nitride of the dielectric of the present invention during write or erase is more than twice as large as the field strength in the MNOS dielectrics during the same write/erase cycles. Since write/erase time decreases rapidly with increasing field strength, the write/erase times are reduced in the present invention.

There are two advantages of the silicon dioxide layer (27,47) above the titanium dioxide (26,46). One is that writing efficiency of the memory element is increased. Writing efficiency can be measured as the amount of threshold voltage shift per unit of write time for a constant gate voltage. When carriers tunnel into the titanium dioxide layer (26,46), some of them continue through the layer (26,46) and are attracted to the gate. If a carrier reaches the gate (13,33) it has no effect on threshold voltage shift. If carriers of the opposite polarity leave the gate and get trapped in the titanium dioxide, they will nullify part of the threshold voltage shift due to the carriers tunneling from the silicon. The greater the percentage of tunneling carriers that reach the gate, or carriers of opposite polarity that leave the gate and get trapped in the titanium dioxide, the longer the write time must be to achieve a desired threshold shift. Here, the silicon dioxide layer (27,47) acts as a barrier to the carriers from the silicon and carriers of opposite polarity from the gate, thereby increasing the writing efficiency. The other advantage of the silicon dioxide layer (27,47) is that it, along with the oxide 21A over the source and drain areas and the oxide 23 or nitride 43 underneath the titanium dioxide (26,46) completely surrounds the titanium dioxide (26,46) and prevents the stored charge from leaking off the titanium dioxide (26,46). This increases the retentivity of the memory element and is a key feature of the invention.

This invention has been described with respect to using an MOS transistor as a memory cell but the invention is not so limited. It is possible to use the silicon substrate/gate dielectric/gate structure as the memory cell. Reading whether a "1" or "0" is in the cell can be accomplished by sensing the capacitance of the structure at the read voltage, which will be HIGH or LOW corresponding to accumulation or depletion respectively depending on whether or not charge is stored in the dielectric. The invention is useful not only for storing holes in the titanium dioxide but also for storing electrons. If a P-type substrate is used the device will operate as described if the voltage polarity is reversed. The charge conduction mechanism in that case will be by electrons instead of holes.

While this invention has been described with reference to illustrated embodiments, it is not intended that this description be construed in a limiting sense. Various modifications of the illustrated embodiments, as well as other embodiments of the invention, will be apparent to persons skilled in the art upon reference to this description. It is therefore contemplated that the appended claims will cover any such modifications of embodiments as fall within the true scope of the invention.

What is claimed is:

1. A memory element comprising:
   a semiconductor body, comprising source and drain regions formed therein, and comprising a channel region which connects said source region with said drain region within said semiconductor body;
   a first insulating layer, disposed upon said body above said channel region;
   a second insulating layer, on said first insulating layer, said second insulating layer having a dielectric constant which is greater than 15;
   a third insulating layer on said second insulating layer, said third insulating layer comprising silicon dioxide; and
   a conducting layer on said third insulating layer.

2. An element according to claim 1, wherein said second insulating layer comprises an oxide of a metal selected from the group consisting of titanium, hafnium, zirconium or tantalum.

3. An element according to claim 2, wherein said first insulating layer is less than 150 Angstroms thick.

4. An element according to claim 1, 2, or 3, wherein said first insulating layer comprises silicon dioxide.

5. An element according to claim 1, 2, or 3, wherein said first insulating layer comprises silicon nitride.

6. An element according to claim 1, 2, or 3, wherein said second insulating layer is less than 2,000 Angstroms thick.

7. An element according to claim 1, 2, or 3, wherein said second insulating layer comprises titanium dioxide.

8. An element according to claim 7, wherein said second insulating layer comprises titanium dioxide in the form known as rutile.

9. An element according to claim 8, wherein said conducting layer comprises aluminum.

10. An element according to claim 1, 2, or 3, wherein said third insulating layer is less than 250 Angstroms thick.

11. An element according to claim 8, further comprising first, second, and third metal contacts ohmically connected to said source region, to said drain region, and to said conducting layer respectively.

* * * * *